United States Patent
Vashchenko et al.

(10) Patent No.: US 7,221,036 B1
(45) Date of Patent: May 22, 2007

(54) BJT WITH ESD SELF PROTECTION

(75) Inventors: Vladislav Vashchenko, Palo Alto, CA (US); Peter J. Hopper, San Jose, CA (US); Yuri Mirgorodski, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 59 days.

(21) Appl. No.: 11/129,957

(22) Filed: May 16, 2005

(51) Int. Cl.
 *H01L 27/082* (2006.01)
 *H01L 27/102* (2006.01)
 *H01L 29/70* (2006.01)
 *H01L 31/11* (2006.01)

(52) U.S. Cl. .................. 257/565; 257/558; 257/557; 257/378; 257/370

(58) Field of Classification Search ........... 257/205, 257/273, 355–357, 370, 378, 474, 477, 526, 257/539, 542, 552, 555–558, 563, 565
See application file for complete search history.

(56) References Cited

U.S. PATENT DOCUMENTS

| | | | | |
|---|---|---|---|---|
| 5,541,433 A | * | 7/1996 | Lien | ............ 257/378 |
| 5,874,767 A | * | 2/1999 | Terashima et al. | .......... 257/487 |
| 6,815,732 B1 | | 11/2004 | Vashchenko et al. | ........ 257/107 |
| 6,815,800 B2 | * | 11/2004 | Mallikarjunaswamy | ..... 257/565 |
| 7,145,206 B2 | * | 12/2006 | Mallikarjunaswamy | ..... 257/370 |
| 2002/0158270 A1 | * | 10/2002 | Yamamoto et al. | ......... 257/200 |

OTHER PUBLICATIONS

U.S. Appl. No. 10/821,287, filed Apr. 9, 2004, Vashchenko et al.
U.S. Appl. No. 11/060,877, filed Feb. 18, 2005, Vashchenko et al.
U.S. Appl. No. 10/649,989, filed Aug. 27, 2003, Vashchenko et al.
U.S. Appl. No. 10/650,000, filed Aug. 27, 2003, Vashchenko et al.

* cited by examiner

*Primary Examiner*—Zandra V. Smith
*Assistant Examiner*—Thanh Y. Tran
(74) *Attorney, Agent, or Firm*—Mark C. Pickering

(57) ABSTRACT

A ballasting region is placed between the base region and the collector contact of a bipolar junction transistor to relocate a hot spot away from the collector contact of the transistor. Relocating the hot spot away from the collector contact prevents the collector contact from melting during an electrostatic discharge (ESD) pulse.

15 Claims, 4 Drawing Sheets

BJT WITH ESD SELF PROTECTION

BACKGROUND OF THE INVENTION

1. Field of the Invention

The present invention relates to BJTs and, more particularly, to a BJT with ESD self protection.

2. Description of the Related Art

A bipolar junction transistor (BJT) is a well-known element that is utilized in a variety of circuits. BJTs are commonly formed by sandwiching a region of a first conductivity type, known as a base, between two regions of a second conductivity type, known as an emitter and a collector.

FIG. 1 shows a cross-sectional view that illustrates a prior-art BJT 100. As shown in FIG. 1, BJT 100 includes a p− substrate 110, and a buried layer 112 that is formed in p− substrate 110. Buried layer 112 includes an inner n+ layer 112A and an outer diffused n layer 112B that extends out from inner n+ layer 112A.

Further, BJT 100 includes an n− epitaxial layer 114 that is formed on buried layer 112. BJT 100 is a high-voltage device which, when compared to a conventional low-voltage bipolar device, has a substantially thicker epitaxial layer. For example, n− epitaxial layer 114 can be approximately 15–17 um thick.

In addition, BJT 100 includes a p− base region 120 that is formed in n− epitaxial layer 114, an n+ emitter region 122 that is formed in p− base region 120, and a sinker down region 124 that is formed in n− epitaxial layer 114. Sinker down region 124 includes an inner n+ region 124A and an outer diffused n region 124B that surrounds inner n+ region 124A.

Sinker down region 124, along with n-type buried layer 112 and n− epitaxial layer 114, function as the collector. (N+ sinker down region 124A can alternately extend down to contact n+ buried layer 112A, be combined with an n+ sinker up region that extends up from n+ buried layer 112A, or be implemented in any conventional manner.)

As further shown in FIG. 1, BJT 100 also includes a layer of isolation material 130 that is formed on the surface of n− epitaxial layer 114, and a metal base contact 132 that is formed through isolation layer 130 to make an electrical connection with p− base region 120. BJT 100 additionally includes a metal emitter contact 134 that is formed through isolation layer 130 to make an electrical connection with n+ emitter region 122, and a metal collector contact 136 that is formed through isolation layer 130 to make an electrical connection with sinker down region 124. Further, p− base region 120 is separated from collector contact 136 by a separation distance SD.

For normal operation, n+ emitter region 122 is commonly connected to ground, while n+ collector region 124 is connected to a positive voltage. Under these biasing conditions, BJT 100 is turned off when ground is placed on p− base region 120. In this case, the voltage on p− base region 120 is equal to the voltage on n+ emitter region 122, and less than the voltage on n+ collector region 124, thereby reverse biasing the base-collector junction.

On the other hand, when the voltage on p− base region 120 rises to approximately 0.7V, BJT 100 turns on. In this case, the voltage on p− base region 120 forward biases the base-emitter junction. When the base-emitter junction becomes forward biased, p− base region 120 begins injecting holes into emitter region 122, while n+ emitter region 122 begins injecting electrons into base region 120. The electrons injected into p− base region 120 diffuse through the lightly-doped base region 120, and are swept into n− epitaxial layer 114 by the electric field across the reverse-biased, base-collector junction.

Once swept into n− epitaxial layer 114, the electrons follow the lowest resistance path to n+ collector region 124. In this example, the lowest resistance path is illustrated by a current path P that moves vertically down, horizontally through n+ buried layer 112A, and vertically up to sinker down region 124. Normal operation continues as long as holes can continue to be supplied to p− base region 120 (for injection into n+ emitter region 122) via an external base current that flows into base region 120.

In addition to normal operation, BJT 100 can also be utilized to provide the pads of a semiconductor device with electrostatic discharge (ESD) protection from voltage spikes. For example, n+ collector region 124 can be connected to an I/O pad to protect the I/O pad from voltage spikes.

During an ESD event, the voltage on n+ sinker down region 124 rises quickly, which causes the voltage on n-type buried layer 112 and n− epitaxial layer 114 to rise with respect to the voltage on p− base region 120, thereby reverse biasing the pn junction between n− epitaxial layer 114 and p− base region 120.

When the rising voltage on n− epitaxial layer 114 (the collector) exceeds a breakdown voltage of the pn junction, avalanche multiplication causes large numbers of holes to be injected into p− base region 120, and large numbers of electrons to be injected into n− epitaxial layer 114. Ideally, the electrons injected into n− epitaxial layer 114 follow the same low-resistance path P to sinker down region 124 as described above.

On the other hand, the holes injected into p− base region 120 flow out of p− base region 120 into a circuit which causes the potential on p− base region 120 to rise and forward bias the base-emitter junction. For example, when a BJT is utilized as an ESD protection device, the base of the BJT can be connected to ground via a resistor. In this case, when the hole current from p− base region 120 flows to ground via the resistor, the resistor causes the voltage on p− base region 120 to rise and forward bias the base-emitter junction.

When the base-emitter junction becomes forward biased, p− base region 120 begins injecting holes into n+ emitter region 122, while n+ emitter 122 begins injecting electrons into p− base region 120. The electrons injected into p− base region 120 from n+ emitter region 122 diffuse to the base-collector junction, where the electrons are swept into n− epitaxial layer 114 by the electric field across the reverse-biased junction. The electrons from n+ emitter region 122 join the avalanche-generated electrons flowing to sinker down region 124, thereby significantly increasing the current sunk by BJT 100.

As noted above, the electrons injected into n− epitaxial layer 114 ideally follow the low-resistance current path P to sinker down region 124. However, due to the high electric field that is present during an ESD event, and the large number of electrons that are injected into the lightly-doped epitaxial layer 114, the electrons can flow laterally just below the surface of epitaxial layer 114 from p− base 120 to sinker down region 124.

As illustrated in FIG. 1, one problem with a significant lateral electron flow at the surface of n− epitaxial layer 114 is that the electron flow causes the lattice temperature to rise significantly, and can cause a localized hot spot 140 to develop next to the interface between sinker down region 124 and collector contact 136. Hot spot 140 can cause collector contact 136 to melt which, in turn, can lead to the electrical inoperability of BJT 100. Thus, there is a need for a BJT which can be used as an ESD protection device without being melted by an ESD event.

DETAILED DESCRIPTION OF THE INVENTION

Figure 1:
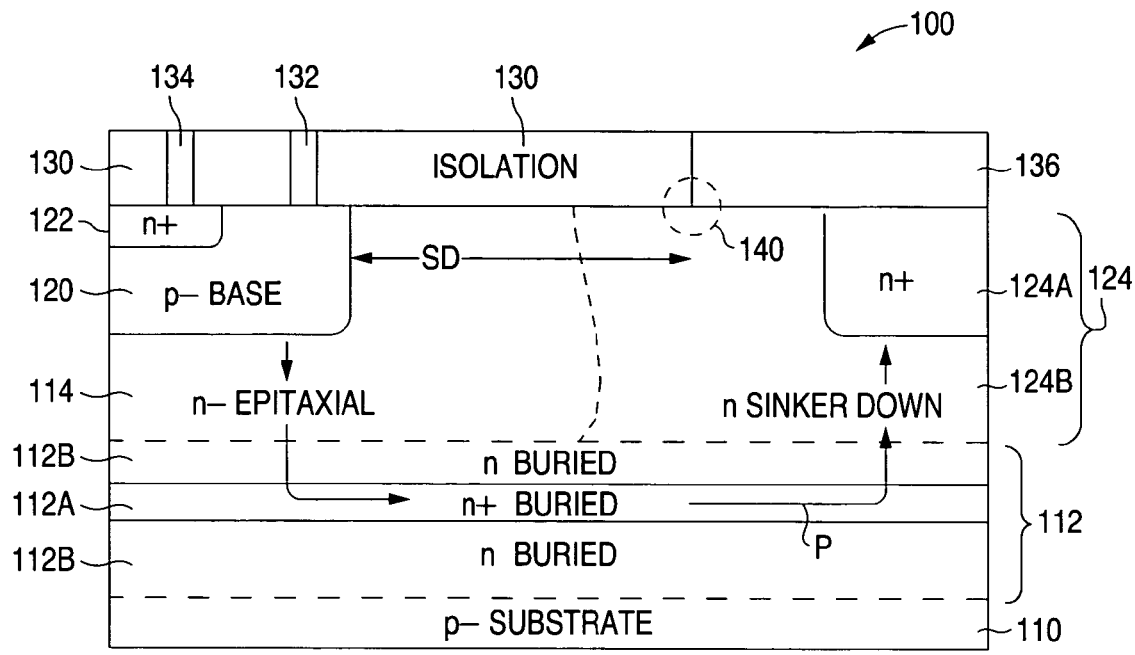
FIG. 1 is a cross-sectional view illustrating a prior-art bipolar junction transistor (BJT) 100.
Figure 2:
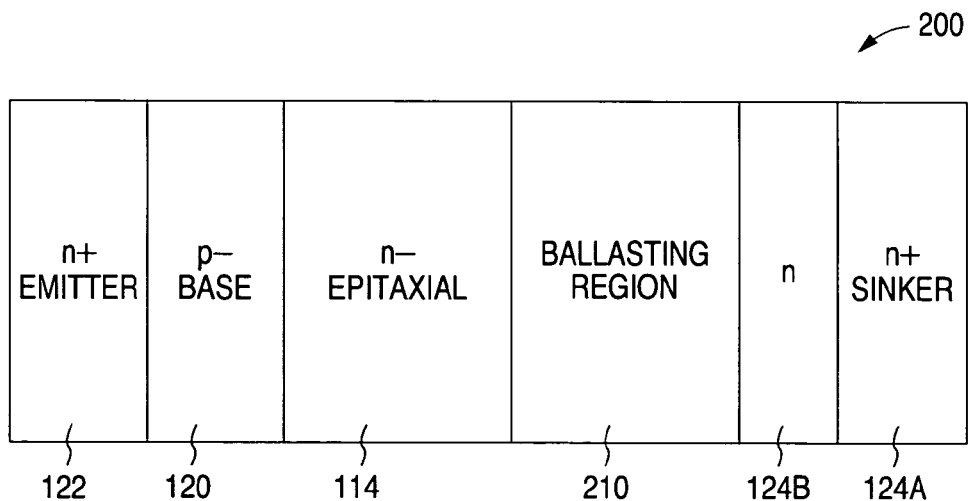
FIG. 2 is a plan view illustrating an example of a bipolar junction transistor (BJT) 200 in accordance with the present invention.

FIG. 2 shows a plan view that illustrates an example of a bipolar junction transistor (BJT) 200 in accordance with the present invention. As described in greater detail below, BJT 200 relocates a hot spot away from the collector contact, thereby allowing BJT 200 to be used in electro-static discharge (ESD) applications without melting the collector contact.

BJT 200 is similar to BJT 100 and, as a result, utilizes the same reference numerals to designate the structures which are common to both BJTs. As shown in FIG. 2, BJT 200 differs from BJT 100 in that BJT 200 includes a ballasting region 210 that contacts the surface of n– epitaxial layer 114 and lies between p– base region 120 and sinker down region 124. In operation, ballasting region 210 relocates the hot spot away from collector contact 136, thereby allowing BJT 200 to be used in ESD applications without destroying the collector contact.

Figure 3A:
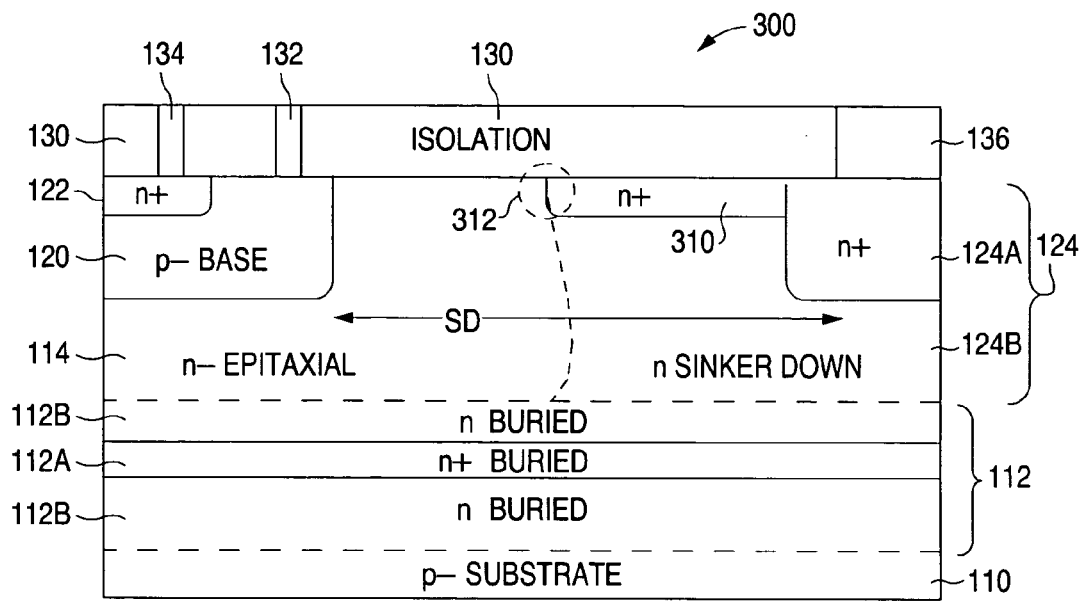
FIG. 3A is a cross-sectional view illustrating an example of an embodiment 300 of BJT 200 in accordance with the present invention.

FIG. 3A shows a cross-sectional view that illustrates an example of an embodiment 300 of BJT 200 in accordance with the present invention. As shown in FIG. 3A, ballasting region 210 of embodiment 300 includes an n+ protection region 310 that contacts the surface of n– epitaxial layer 114.

In the FIG. 3A example, n+ protection region 310 has a depth, measured along a line normal to the surface of n– epitaxial layer 114, which is significantly shallower than p– base region 120 and n+ sinker down region 124A. In addition, n+ protection region 310 extends laterally from n+ sinker down region 124A towards p– base region 120, but remains spaced apart from p– base region 120. Further, to accommodate n+ protection region 310, a separation distance SD between p– base region 120 and collector contact 136 is increased.

In operation, in response to an ESD event (e.g., in response to 100 nS of a 2 kV human body model (HBM) stress), embodiment 300 of BJT 200 operates the same as BJT 100 except that n+ protection region 310 forces the hot spot that results from the lateral current flow away from the collector contact region.

As shown in FIG. 3A, n+ protection region 310 causes a localized hot spot 312 to develop at an end E of n+ protection region 310 that lies closest to p– base region 120. Although the peak temperature lies at the end, substantially elevated temperatures also extend towards p– base region 120 and n+ sinker down region 124A.

As a result, the distances between the elements must be adjusted to insure that the temperature on the metal contacts is insufficient to melt the contacts. Thus, the use of n+ protection region 310 relocates the hot spot away from collector contact 136, thereby allowing embodiment 300 of BJT 200 to be used in ESD applications without destroying the collector contact.

Figure 3B:
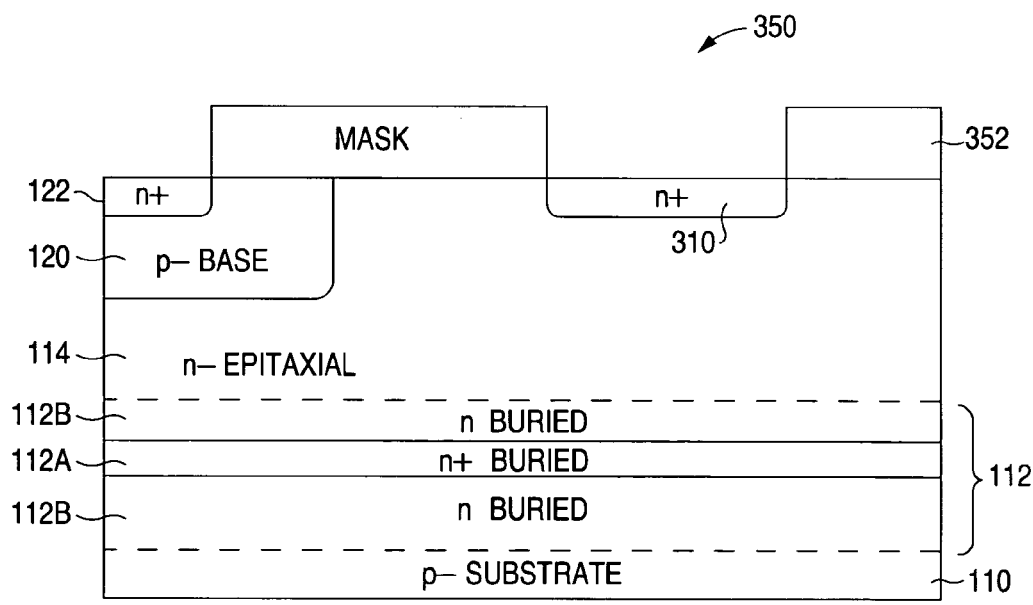
FIG. 3B is a cross-sectional view illustrating an example of a method of forming embodiment 300 of BJT 200 in accordance with the present invention.

FIG. 3B shows a cross-sectional view that illustrates an example of a method of forming embodiment 300 of BJT 200 in accordance with the present invention. As shown in FIG. 3B, a semiconductor device 350 is conventionally formed to have p– base region 120 formed in n– epitaxial layer 114.

Following this, as further shown in FIG. 3B, a mask 352 is formed and patterned to expose a portion of p– base 120, and a portion of n– epitaxial layer 114 that is spaced apart from p– base region 120. Next, the exposed regions are implanted with an n-type dopant to form n+ emitter region 122 and n+ protection region 310. Mask 352 is then removed.

After this, the method continues with conventional steps. In the FIG. 3B example, no additional masking steps are required to form n+protection region 310 because n+ protection region 310 is formed at the same time as n+ emitter region 122. Further, n-type sinker down region 124 can be formed before or after regions 122 and 310 are formed. Alternately, n+ protection region 310 can have a different depth or dopant concentration by utilizing separate masking and implant steps to form n+ emitter region 122 and n+ protection region 310.

Figure 4A:
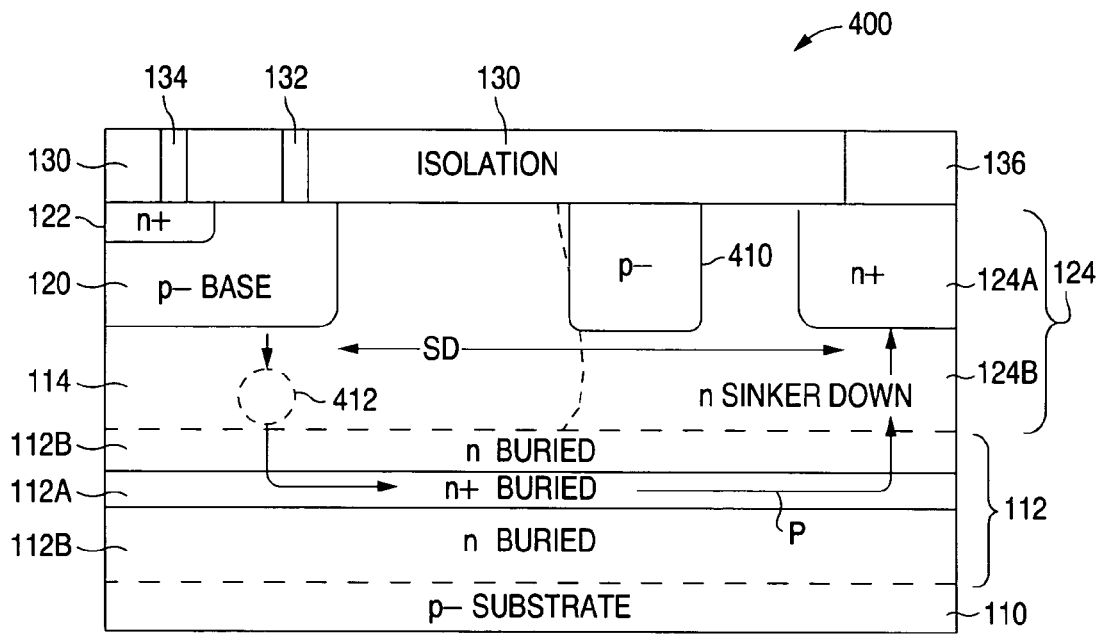
FIG. 4A is a cross-sectional view illustrating an example of an embodiment 400 of BJT 200 in accordance with the present invention.

FIG. 4A shows a cross-sectional view that illustrates an example of an embodiment 400 of BJT 200 in accordance with the present invention. As shown in FIG. 4A, ballasting region 210 of embodiment 400 includes an electrically-floating p– protection region 410 that contacts the surface of n– epitaxial layer 114. Further, to accommodate p– protection region 410, a separation distance SD between p– base region 120 and collector contact 136 is increased.

In operation, in response to an ESD event (e.g., in response to 100 nS of a 2 kV HBM stress), embodiment 400 of BJT 200 operates the same as BJT 100 except that p– protection region 410 forces the electron flow vertically down and away from the surface of epitaxial layer 114 substantially along the current path P, thereby eliminating or substantially reducing the lateral surface flow of electrons.

As shown in FIG. 4A, p– protection region 410 causes a localized hot spot 412 to develop at the interface between buried layer 112 and n– epitaxial layer 114. Thus, the use of p–region 410 relocates the hot spot away from collector contact 136. As a result, embodiment 400 of BJT 200 can be used in ESD applications without destroying the collector contact.

Figure 4B:
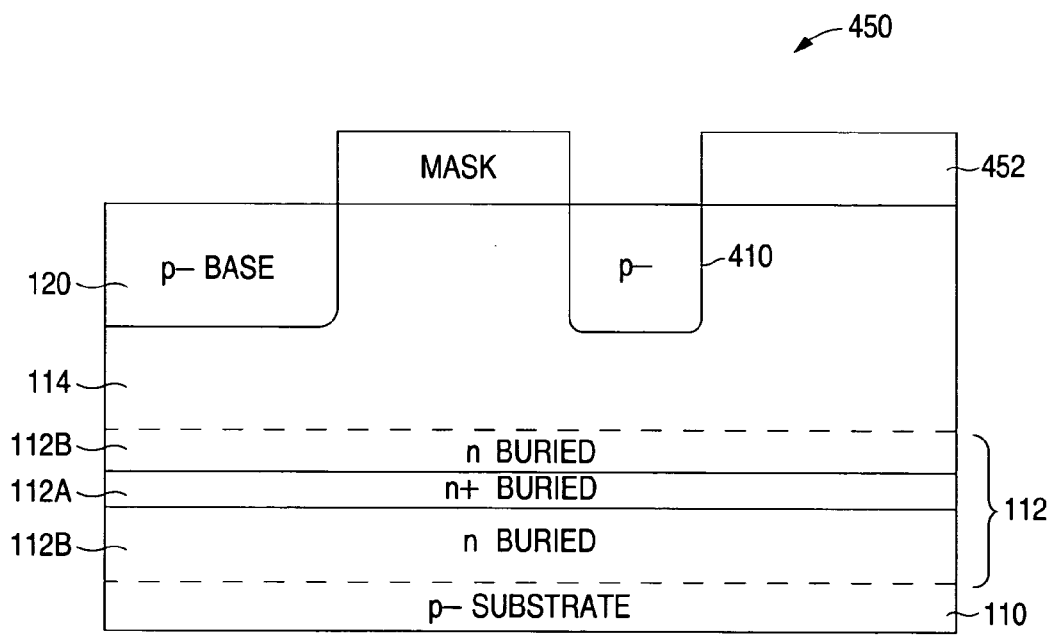
FIG. 4B is a cross-sectional view illustrating an example of a method of forming embodiment 400 of BJT 200 in accordance with the present invention.

FIG. 4B shows a cross-sectional view that illustrates an example of a method of forming embodiment 400 of BJT 200 in accordance with the present invention. As shown in FIG. 4B, the method utilizes a semiconductor device 450 that has been conventionally formed to have an n− epitaxial layer 114.

Following this, as further shown in FIG. 4B, a mask 452 is formed and patterned to expose spaced-apart portions of n− epitaxial layer 114. Next, the exposed regions are implanted with a p-type dopant to form p− base region 120 and p− protection region 410. Mask 452 is then removed.

After this, the method continues with conventional masking and implanting steps to form n+ emitter region 122 in p− base region 120 and n-type sinker down region 124 in epitaxial layer 114 so that p− protection region 410 lies between p− base region and n+ sinker down region 124A.

In the FIG. 4B example, no additional masking steps are required to form p− protection region 410 because p− protection region 410 is formed at the same time as p− base region 120. Alternately, p− protection region 410 can have a different depth or dopant concentration by utilizing separate masking and implant steps to form p− base region 120 and p− protection region 410.

Figure 5:
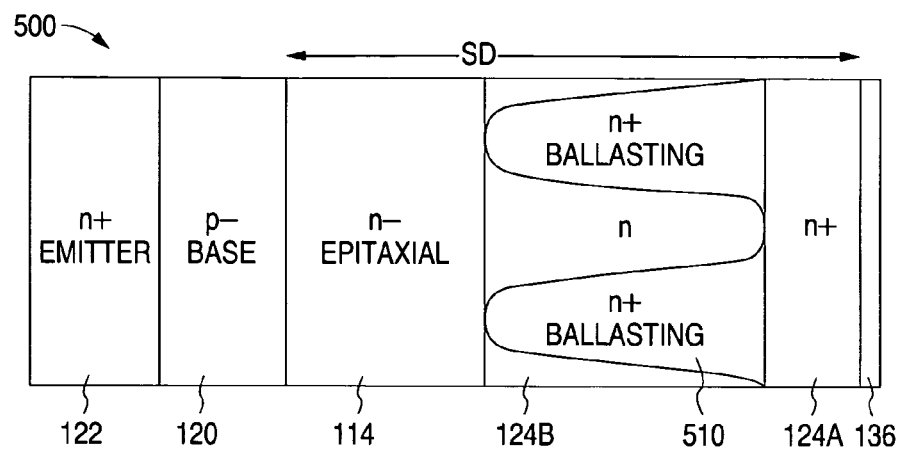
FIG. 5 is a plan view illustrating an example of an embodiment 500 of BJT 200 in accordance with the present invention.

FIG. 5 shows a plan view that illustrates an example of an embodiment 500 of BJT 200 in accordance with the present invention. As shown in FIG. 5, ballasting region 210 of embodiment 500 includes an n+ sinker down extension 510 that has a finger shape. Further, to accommodate n+ sinker down extension 510, a separation distance SD between p− base region 120 and collector contact 136 is increased.

In operation, in response to an ESD event (e.g., in response to 100 nS of a 2 kV human body model (HBM) stress), embodiment 500 of BJT 200 operates the same as BJT 100 except that n+ sinker down extension 510 forces the hot spot that results from the lateral current flow away from the collector contact region in a manner similar to embodiment 300. As a result, embodiment 500 of BJT 200 can be used in ESD applications without destroying the collector contact.

Embodiment 500 can be formed in the same manner as embodiment 300, except that mask 352 illustrated in FIG. 3B must be modified to have a finger shaped pattern as illustrated by n+ ballasting region 510. Thus, n+ ballasting region 510 can be formed at the same time that n+ emitter 122 is formed.

Figure 6:
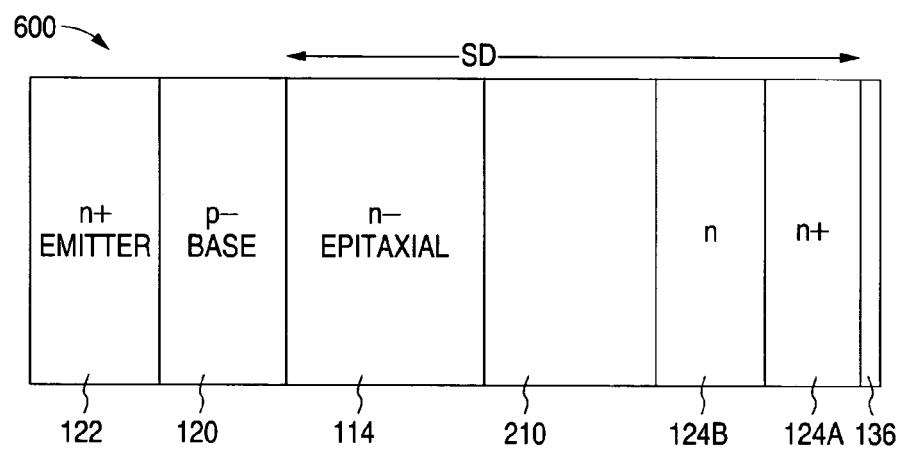
FIG. 6 is a plan view illustrating an example of an embodiment 600 of BJT 200 in accordance with the present invention.

FIG. 6 shows a plan view that illustrates an example of an embodiment 600 of BJT 200 in accordance with the present invention. As shown in FIG. 6, ballasting region 210 of embodiment 600 includes a significantly larger, e.g., 2×, separation distance SD between p− base region 120 and collector contact 136 than would be found in a standard BJT, such as BJT 100.

In operation, in response to an ESD event (e.g., in response to 100 nS of a 2 kV HBM stress), embodiment 600 of BJT 200 operates the same as BJT 100 except that the larger separation distance SD forces the electron flow vertically down and away from the surface of n− epitaxial layer 114 substantially along the current path P, thereby eliminating or substantially reducing the lateral surface flow of electrons.

The significantly larger separation distance SD causes a localized hot spot to develop at the interface between buried layer 112 and n− epitaxial layer 114. Thus, the use of a significantly larger separation distance SD relocates the hot spot away from collector contact 136. As a result, embodiment 600 of BJT 200 can be used in ESD applications without destroying the collector contact.

Figure 7:
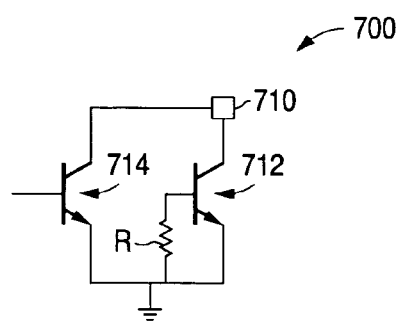
FIG. 7 is a schematic diagram illustrating an example of a circuit 700 in accordance with the present invention.

FIG. 7 shows a schematic diagram that illustrates an example of a circuit 700 in accordance with the present invention. As shown in FIG. 7, circuit 700 includes a pad 710, and an ESD BJT 712 that is connected between pad 710 and ground. In addition, circuit 700 includes a resistor R that is connected between ESD BJT 712 and ground, and a circuit BJT 714 that is connected between pad 710 and ground.

ESD BJT 712 can be implemented with embodiments 300–600 of BJT 200, while circuit BJT 714 can be implemented with a conventional BJT, such as BJT 100, that can be damaged by an ESD strike. In each case, the separation distance SD between p− base region 120 and collector contact 136 of BJT 712 is greater than the separation distance SD of BJT 714. Further, when embodiment 600 is utilized, the separation distance SD of BJT 712 is substantially greater, e.g., 2×, than the separation distance SD of BJT 714. In operation, when an ESD event occurs, ESD BJT 712 shunts the voltage strike to ground, thereby protecting circuit BJT 714 from damage.

Thus, the present invention provides a BJT that can be utilized as an ESD protection device without melting the collector contact. One of the advantages of the present invention is that ESD BJT 712 can be modeled or simulated in cases where other devices, such as a silicon controlled rectifier (SCR) structures, can not be modeled or simulated.

Further, the present invention provides a BJT that can function as both a conventional bipolar device (with greater resistance), and as an ESD protection device. Thus, in the present invention, circuit BJT 714 can optionally be eliminated (if the base of circuit BJT 714 is connected to a circuit which can forward bias the base-emitter junction during an ESD event) because ESD BJT 712 can function as a conventional bipolar device (with greater resistance) during normal circuit operation, and as an ESD protection device should an ESD event occur. As a result, the BJT of the present invention provides ESD self protection.

It should be understood that the above descriptions are examples of the present invention, and that various alternatives of the invention described herein may be employed in practicing the invention. For example, elements of the above embodiments can be combined together. Thus, it is intended that the following claims define the scope of the invention and that structures and methods within the scope of these claims and their equivalents be covered thereby.

What is claimed is:

1. A circuit comprising:
    a bipolar junction transistor having:
        a semiconductor material of a first conductivity type;
        an epitaxial material of the second conductivity type that contacts the semiconductor material, the epitaxial material having a top surface and a dopant concentration;
        a base region of the first conductivity type that contacts the epitaxial material, the base region having a depth measured normal to the top surface of the epitaxial material;
        an emitter region of the second conductivity type that contacts the base region, the emitter region having a dopant concentration;
        a sinker down region of the second conductivity type that contacts the epitaxial material, the sinker down region having a dopant concentration; and
        a ballasting region that contacts the top surface of the epitaxial material and lies between the base region and the sinker down region.

2. The circuit of claim 1 and further comprising:
a layer of isolation material formed on the epitaxial material; and
a contact formed through the layer of isolation material to make an electrical connection with the sinker down region, a lattice temperature adjacent to the contact being insufficient to melt the contact during an ESD event.

3. The circuit of claim 2 wherein the ballasting region has a second conductivity type and a depth measured normal to the top surface of the epitaxial material, the depth of the ballasting region being substantially less than the depth of the base region.

4. The circuit of claim 2 wherein the ballasting region has a first conductivity type.

5. The circuit of claim 2 wherein the ballasting region has a finger shape.

6. The circuit of claim 2 and further comprising a bipolar junction device having:
an epitaxial material of the second conductivity type that contacts the semiconductor material;
a base region of the first conductivity type that contacts the epitaxial material of the bipolar junction device;
an emitter region of the second conductivity type that contacts the base region of the bipolar junction device;
a sinker down region of the second conductivity type that contacts the epitaxial material of the bipolar junction device; and
a contact formed through the layer of isolation material to make an electrical connection with the sinker down region of the bipolar junction device.

7. The circuit of claim 6 wherein a lattice temperature adjacent to the contact of the bipolar junction device is sufficient to melt the contact during an ESD event.

8. The circuit of claim 7 wherein the ballasting region has a second conductivity type and a depth measured normal to the top surface of the epitaxial material, the depth of the ballasting region being substantially less than the depth of the base region.

9. The circuit of claim 7 wherein the ballasting region has a first conductivity type.

10. The circuit of claim 7 wherein the ballasting region has a finger shape.

11. The circuit of claim 7 wherein:
a first separation distance exists between the base region and the contact of the bipolar junction transistor, and a second separation distance exists between the base region and the contact of the bipolar junction device, the first separation distance being greater than the second separation distance.

12. The circuit of claim 11 wherein the first separation distance is substantially greater than the second separation distance.

13. The circuit of claim 11 wherein the ballasting region has a second conductivity type and a depth measured normal to the top surface of the epitaxial material, the depth of the ballasting region being substantially less than the depth of the base region.

14. The circuit of claim 11 wherein the ballasting region has a first conductivity type.

15. The circuit of claim 11 wherein the ballasting region has a finger shape.

* * * * *